United States Patent
Yonezawa

(10) Patent No.: US 7,173,458 B2
(45) Date of Patent: Feb. 6, 2007

(54) SEMICONDUCTOR DEVICE

(75) Inventor: Takemi Yonezawa, Nagano-ken (JP)

(73) Assignee: Seiko Epson Corporation (JP)

( * ) Notice: Subject to any disclaimer, the term of this patent is extended or adjusted under 35 U.S.C. 154(b) by 118 days.

(21) Appl. No.: 10/932,881

(22) Filed: Sep. 2, 2004

(65) Prior Publication Data

US 2005/0083102 A1  Apr. 21, 2005

(30) Foreign Application Priority Data

Sep. 3, 2003  (JP)  ............. 2003-311399

(51) Int. Cl.
*H03B 1/00*  (2006.01)
(52) U.S. Cl. .................. 327/108; 327/112
(58) Field of Classification Search ........... 327/108, 327/112, 389, 391, 65; 326/82, 83, 86
See application file for complete search history.

(56) References Cited

U.S. PATENT DOCUMENTS

| | | | | |
|---|---|---|---|---|
| 5,939,904 A | | 8/1999 | Fetterman et al. ......... 327/67 |
| 6,111,431 A | * | 8/2000 | Estrada ................ 326/83 |
| 6,294,932 B1 | | 9/2001 | Watarai ................ 326/83 |
| 6,356,141 B1 | * | 3/2002 | Yamauchi ............. 327/108 |
| 6,608,509 B1 | | 8/2003 | Mizuno et al. ......... 327/149 |
| 6,611,157 B2 | | 8/2003 | Usui ................. 327/112 |
| 6,812,777 B2 | | 11/2004 | Tamura et al. ......... 327/540 |
| 6,836,149 B2 | | 12/2004 | Chow ................ 326/83 |
| 2005/0007150 A1 | | 1/2005 | Omote ............... 326/83 |

FOREIGN PATENT DOCUMENTS

| | | |
|---|---|---|
| JP | 02-206915 | 8/1990 |
| JP | 08-274620 | 10/1996 |
| JP | 09-018231 | 1/1997 |
| JP | 09-036730 | 2/1997 |
| JP | 11-330947 | 11/1999 |
| JP | 2000-41072 | 2/2000 |
| JP | 2000-134082 | 5/2000 |
| JP | 2000-174608 | 6/2000 |
| JP | 2002-314397 | 10/2002 |
| JP | 2003-333109 | 11/2003 |
| JP | 2003-347920 | 12/2003 |
| JP | 2005-065188 | 3/2005 |
| WO | WO 03/049291 | 6/2003 |

* cited by examiner

*Primary Examiner*—Long Nguyen
(74) *Attorney, Agent, or Firm*—Harness, Dickey & Pierce, P.L.C.

(57) ABSTRACT

A semiconductor device includes a differential signal output circuit that outputs a differential signal, an amplitude control signal generation circuit that generates an amplitude control signal to control an amplitude of the differential signal for the differential signal output circuit, and a center voltage level control signal generation circuit that generates a center voltage level control signal to control a center voltage level of the differential signal. The differential signal output circuit outputs the differential signal having the center voltage level based on the center voltage level control signal and an output level based on the amplitude control signal. A forming region of the center voltage level control signal generation circuit and a forming region of the differential signal output circuit are provided near each other on a semiconductor substrate where operation characteristics of transistors formed respectively in the two forming regions become equal.

4 Claims, 5 Drawing Sheets

SEMICONDUCTOR DEVICE

RELATED APPLICATIONS

This application claims priority to Japanese Patent Application No. 2003-311399 filed Sep. 3, 2003 which is hereby expressly incorporated by reference herein in its entirety.

BACKGROUND

1. Technical Field

The present invention relates to semiconductor devices, and more particularly, to semiconductor devices that output differential signals.

2. Related Art

Interface circuits for high speed transmission of low amplitude differential signals, such as Low Voltage Differential Signals (LVDS) have been conventionally used for a variety of electronic apparatuses. Such interface circuits are used for signal transmission between, for example, a main body of a notebook type personal computer (hereafter, referred to as a "PC") and its liquid crystal display device. In addition, as the densification of various electronic equipment advances, interface circuits for high speed transmission of low amplitude differential signals are also used in substrates, for example, in substrates for liquid crystal displays. For example, there are so-called Mini-LVDS and Reduced Swing Differential Signaling (RSDS). The use of such low amplitude differential signals contributes to lower power consumption and lower Electro Magnetic Interference: electromagnetic interference (EMI) of various types of electrical equipment. RSDS is an interface standard for connecting between the liquid crystal controller and the driver IC. Two bias voltage signals to control the center voltage and the amplitude are inputted from a bias circuit to an RSDS output circuit. The RSDS output circuit outputs differential signals having an amplitude of a predetermined voltage width based on the two inputted bias signals with a predetermined center voltage as a reference (see, for example, Japanese Laid-open Patent Application 2002-314397).

Such an interface circuit is realized by a circuit formed on a semiconductor chip. Therefore, if forming regions of a plurality of transistors to be formed on the semiconductor substrate are far (distant) from one another, the operation characteristics of the transistors may vary, depending on the manufacturing process, for example, threshold voltages may vary, depending on the different locations of the forming regions of the transistors on the semiconductor substrate. For example, when an RSDS output circuit and a bias circuit are provided far from each other on a semiconductor chip, threshold values at which transistors turn on in response to a voltage given by the bias circuit may vary.

In the case of a differential signal, in particular, when the level of the center voltage of the differential signal to be outputted varies, a problem arises in that receiver side equipment that receives the differential signal cannot ensure the reception of the differential signal.

Accordingly, it is an object of the present invention to provide a semiconductor device that can set a center voltage level of a differential signal to a specified value.

SUMMARY

A semiconductor device in accordance with the present invention comprises: a differential signal output circuit that outputs a differential signal; an amplitude control signal generation circuit that generates an amplitude control signal to control an amplitude of the differential signal for the differential signal output circuit; and a center voltage level control signal generation circuit that generates a center voltage level control signal to control a center voltage level of the differential signal, wherein the differential signal output circuit outputs the differential signal having the center voltage level based on the center voltage level control signal and an output level based on the amplitude control signal, and a forming region of the center voltage level control signal generation circuit and a forming region of the differential signal output circuit are provided in the vicinity of (near or proximate) each other on a semiconductor substrate where operation characteristics of transistors formed respectively in the two forming regions become equal.

With such a structure, a semiconductor device that can make a center voltage level of a differential signal a desired value can be realized.

Also, in the semiconductor device in accordance with the present invention, the center voltage level control signal generation circuit may preferably include a circuit equivalent to a circuit included in the differential signal output circuit.

With such a structure, the output characteristics of differential signals can be reliably matched with one another.

Also, in the semiconductor device in accordance with the present invention, a plurality of the differential signal output circuits may be provided, and the equivalent circuit may be provided for each of the plurality of differential signal output circuits, and the amplitude control signal generation circuit may supply the amplitude control signal to each of the plurality of the differential signal output circuits.

With such a structure, when a plurality of differential signal output circuits are included, a semiconductor device that can make the center voltage levels of the respective differential signals equal to a desired value can be realized.

A semiconductor device in accordance with the present invention comprises: a differential signal receiving circuit that receives a first differential signal; a differential signal output circuit that outputs a second differential signal according to the first differential signal; an amplitude control signal generation circuit that generates an amplitude control signal to control an amplitude of the second differential signal for the differential signal output circuit; and a center voltage level control signal generation circuit that generates a center voltage level control signal to control a center voltage level of the second differential signal, wherein the differential signal output circuit outputs the second differential signal having the center voltage level based on the center voltage level control signal and an output level based on the amplitude control signal, and a forming region of the center voltage level control signal generation circuit and a forming region of the differential signal output circuit are provided near each other on a semiconductor substrate where the operation characteristics of transistors formed respectively in the two forming regions become equal.

With such a structure, in a semiconductor device that receives a first differential signal and outputs a second differential signal, the semiconductor device can set the center voltage level of the second differential signal to be outputted to a desired level.

DETAILED DESCRIPTION

Embodiments of the present invention are now described below with reference to the accompanying drawings.

Figure 1:
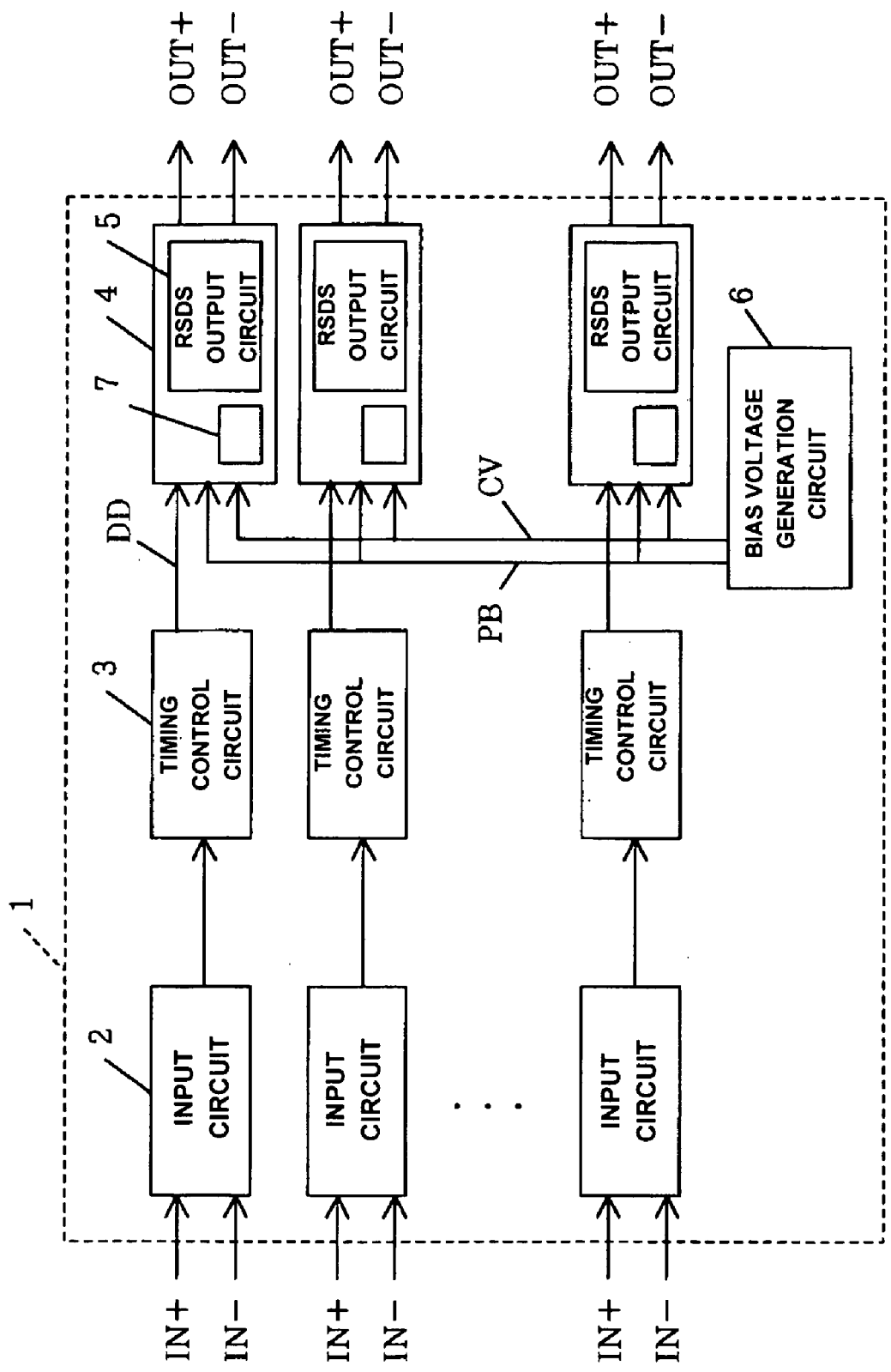
FIG. 1 is a block diagram showing a structure of an interface circuit in accordance with an embodiment of the present invention.

First, referring to FIG. 1, a structure of a semiconductor device that outputs differential signals in accordance with the present embodiment is described. FIG. 1 is a block diagram showing a structure of an interface circuit for outputting differential signals in accordance with the present embodiment.

An interface circuit 1 shown in FIG. 1 is an interface circuit that receives low amplitude differential signals, LVDS, as first differential signals, converts the same into RSDS low amplitude differential signals as second differential signals, and outputs the same. The interface circuit 1 is formed on one semiconductor chip. Also, the interface circuit 1 is inputted with a plurality of VLDS signals, and outputs a plurality of RSDS signals.

The interface circuit 1 has unit interface circuits each formed from an input circuit 2 that is an LVDS receiver circuit, a timing control circuit 3, and an output circuit 4 in a number corresponding to the number of input signals and output signals. Each of the output circuits 4 includes an RSDS output circuit 5 that is a differential signal output circuit. In addition, the interface circuit 1 is provided with a bias voltage generation circuit 6, and the bias voltage generation circuit 6 supplies a variety of predetermined bias voltage signals to each of the output circuits 4.

For example, the interface circuit 1 is a circuit that is installed in a panel substrate of an LCD device of a notebook PC, receives LVDS signals outputted from a main unit of the PC, and transmit signals by RSDS signals in the panel substrate, which is formed on a semiconductor substrate. In other words, the interface circuit 1 may be a semiconductor chip that is mounted and used on a substrate in electronic equipment such as a notebook PC or the like.

Each of the input circuits 2, that is an LVDS receiver circuit, receives low amplitude differential signals IN+ and IN−, and outputs signals "0" and "1" that are digital signals to the timing control circuit 3. The timing control circuit 3 adjusts the timing of the received digital signals and outputs digital signals DD to the output circuit 4. The output circuit 4 including an RSDS output circuit 5 receives the digital signals DD from the timing control circuit 3, and outputs low amplitude differential signals OUT+ and OUT−.

While each of the input circuits 2 receives low amplitude differential signals IN+ and IN−, that oscillate, for example, in the voltage range from 1.15V to 1.35V, each of the output circuits 4 outputs low amplitude differential signals OUT+ and OUT−, that oscillate, for example, in the voltage range from 1.1V to 1.5V. The bias voltage generation circuit 6 generates a reference voltage level signal CV indicating the level of a center voltage and an amplitude control signal PB, and supplies the same to each of the output circuits 4, such that the output circuit 4 outputs low amplitude differential signals OUT+ and OUT− having a prescribed amplitude, plus or minus 0.2V, with a prescribed center voltage, for example, 1.3V, as a reference.

The reference voltage level signal CV is generated in the bias voltage generation circuit 6, and is a voltage value decided in advance. The amplitude control signal PB is generated in the bias voltage generation circuit 6, and is a voltage value to control the amplitude of the differential signals to be outputted from the RSDS output circuit 5. Therefore, the bias voltage generation circuit 6 can be defined as an amplitude control signal generation circuit.

Figure 2:
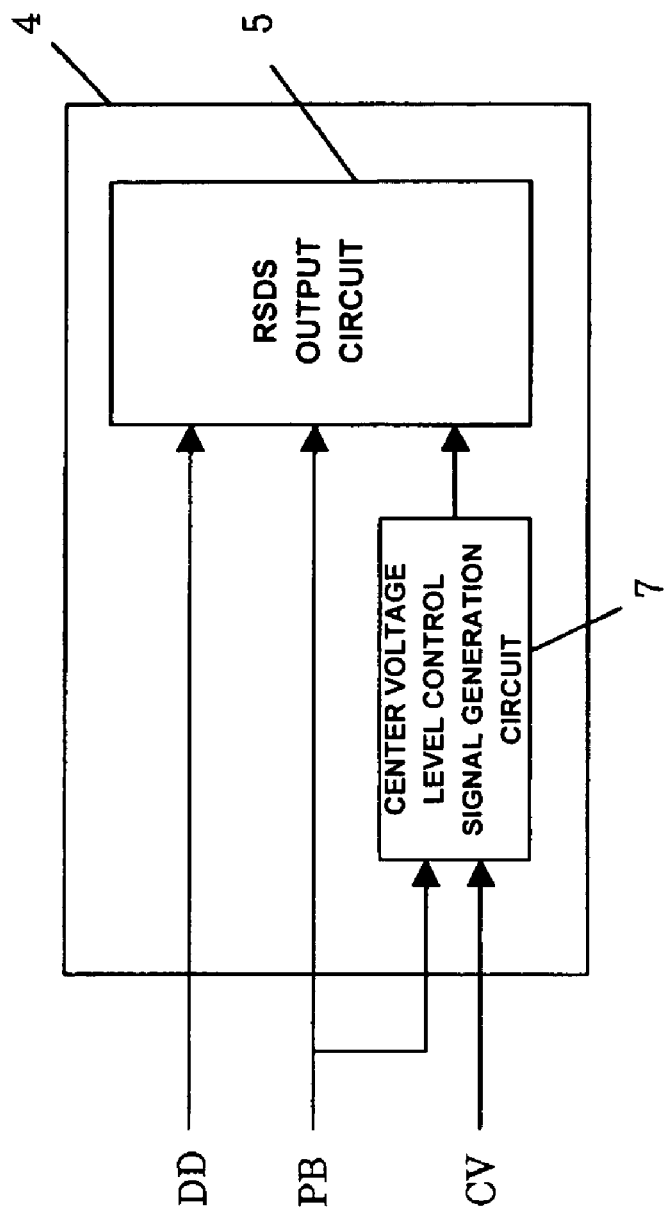
FIG. 2 is a block diagram showing a structure of an output circuit.

FIG. 2 is a block diagram showing a structure of the output circuit 4. The output circuit 4 includes an RSDS output circuit 5, and a center voltage level control signal generation circuit 7 that generates a center voltage level control signal for controlling the center voltage level of low amplitude differential signals OUT+ and OUT−. The digital signal DD from the timing control circuit 3 is inputted to the RSDS output circuit 5, the reference voltage level signal CV is inputted to the center voltage level control signal generation circuit 7, and the amplitude control signal PB is inputted to the RSDS output circuit 5 and the center voltage level control signal generation circuit 7.

Figure 3:
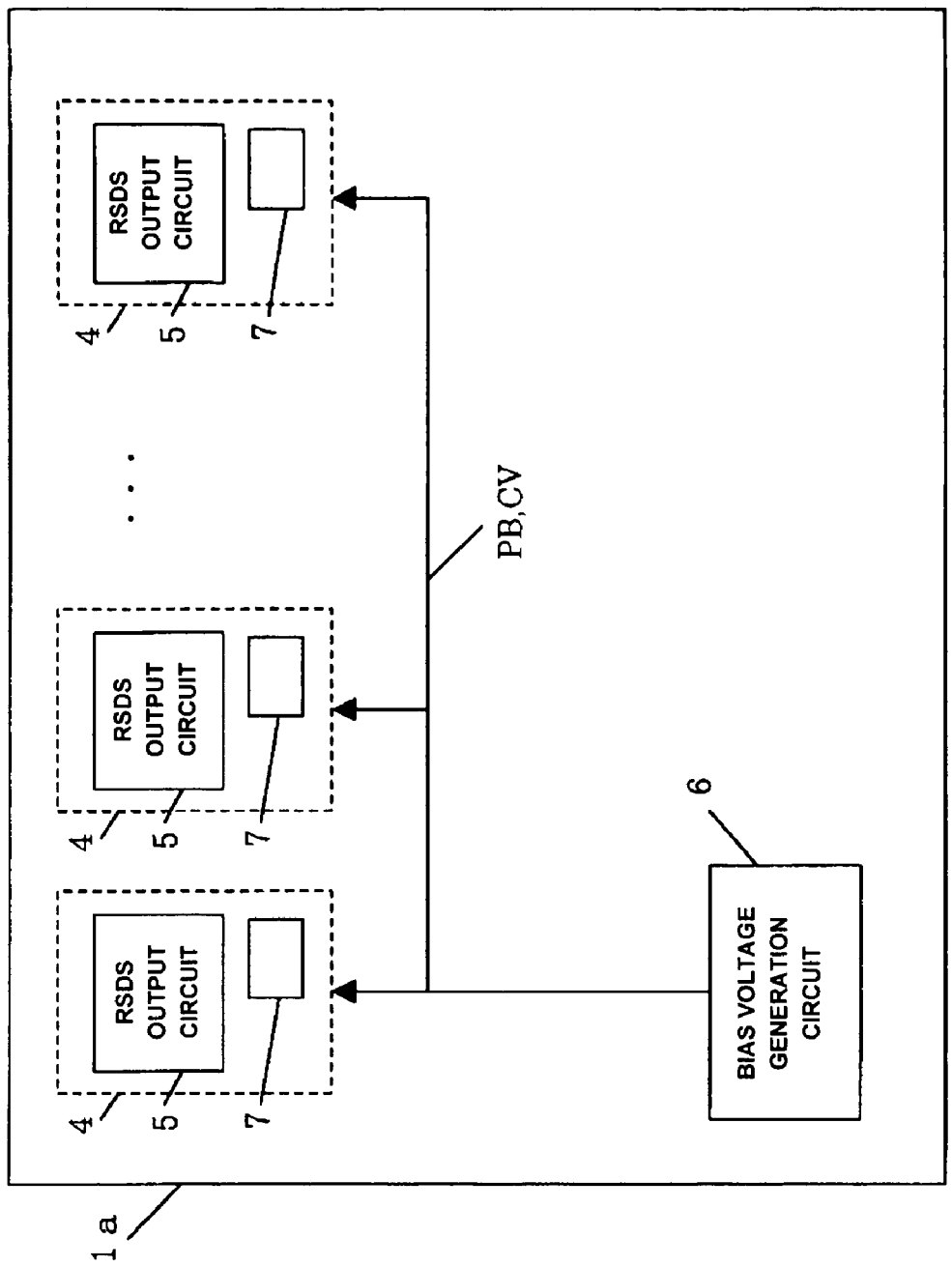
FIG. 3 is a plan view showing a layout of positions of respective circuits on a semiconductor chip.

FIG. 3 is a plan view showing the positional layout of the RSDS output circuit 5, the center voltage level control signal generation circuit 7, and the bias voltage generation circuit 6 on the semiconductor chip. It is noted that, in FIG. 3, circuits, such as, for example, the input circuits 2, the timing control circuits 3 and the like, other than the RSDS output circuits 5, the center voltage level control signal generation circuits 7, and the bias voltage generation circuits 6, are omitted and not illustrated.

The respective positions of the RSDS output circuits 5, the center voltage level control signal generation circuits 7, and the bias voltage generation circuits 6 in FIG. 3 correspond to the positions of areas where the respective circuits are formed. In other words, the RSDS output circuit 5 and the center voltage level control signal generation circuit 7 in each of the output circuits 4 are formed at positions close to each other on the semiconductor chip 1a. In particular, the forming region of the center voltage level control signal generation circuit 7 and the forming region of the RSDC output circuit 5 are arranged near (adjacent) each other such that the operation characteristics of transistors included in the RSDS output circuit 5 and transistors included in the center voltage level control signal generation circuit 7 become equal to one another.

In other words, though the interface circuit 1 is formed on one semiconductor chip as described above, the RSDS output circuit 5 and the corresponding center voltage level control signal generation circuit 7 are provided at positions close to each other in terms of the distance in the layout pattern of the semiconductor chip. Therefore, variations in the performance of transistors on the semiconductor chip, which may be caused by the manufacturing process, can be reduced, and the center voltage of output voltages of low amplitude differential signals OUT+ and OUT− does not vary. As a result, the signal transmission of low amplitude differential signals OUT+ and OUT− can be reliably conducted.

It is noted that the arrangement shown in FIG. 3 is an example for explaining that the forming region of the center voltage level control signal generation circuit 7 and the forming region of the RSDS output circuit 5 are arranged near each other such that the operation characteristics of transistors become equal to one another, and particular arrangements are not limited to this arrangement.

Figure 4:
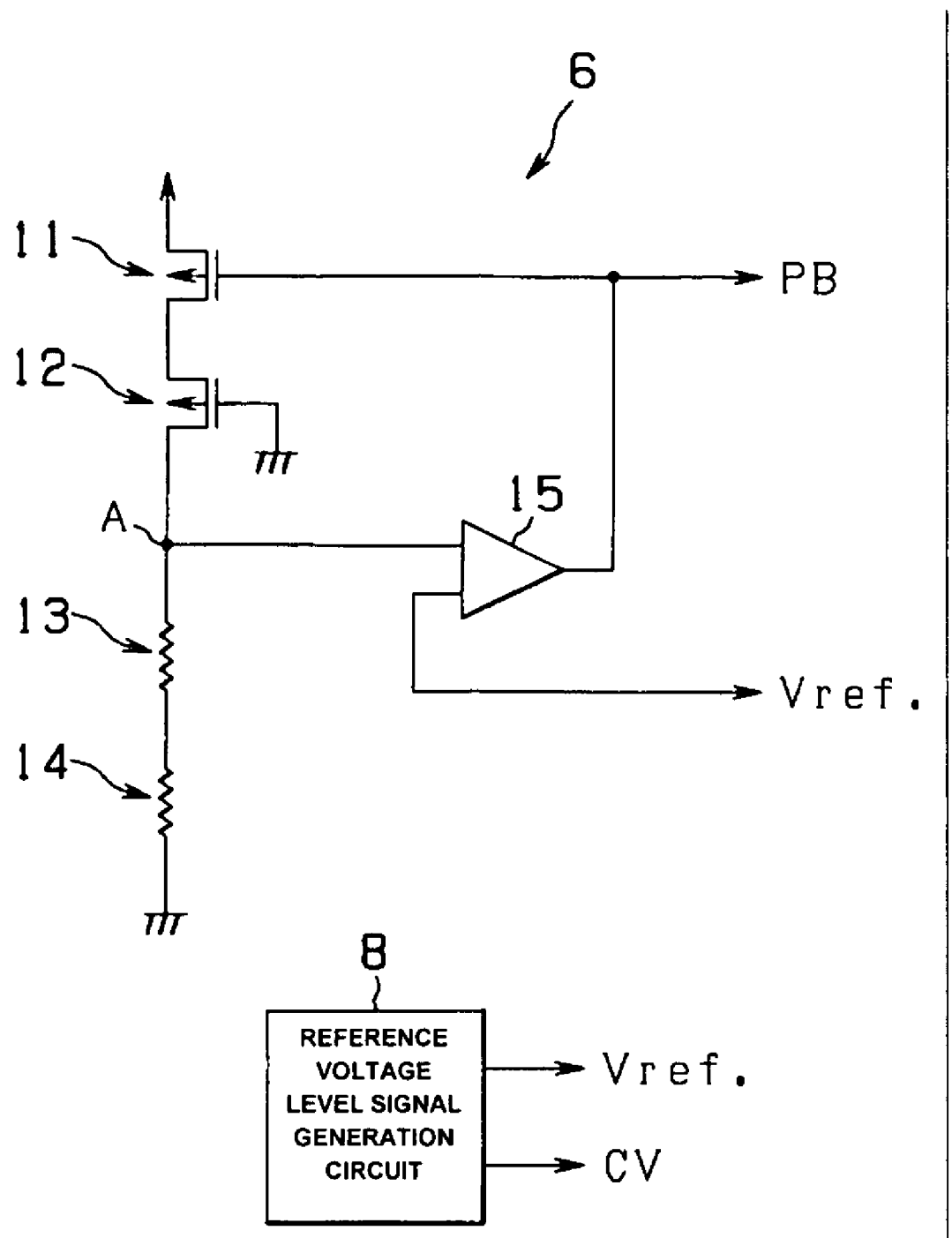
FIG. 4 is a circuit diagram showing a structure of a bias voltage generation circuit.

Next, the structures of the bias voltage generation circuit 6 and the output circuit 4 are describe more particularly. FIG. 4 is a circuit diagram of the structure of the bias voltage generation circuit 6. As shown in FIG. 4, the bias voltage generation circuit 6 includes a reference voltage level signal generation circuit 8, and a series circuit having two serially connected P channel transistors 11 and 12 and two serially connected resistances 13 and 14, which are connected in series to one another. A prescribed voltage is applied to one end of the series circuit, and the other end thereof is connected with the ground. Furthermore, a node A of the P channel transistor 12 and the resistance 13 is connected to one of two input terminals of a differential amplifier 15. The other input terminal of the differential amplifier 15 receives (is inputted with) a certain reference voltage Vref, for example, the same voltage level as the CV. An output terminal of the differential amplifier 15 becomes a gate of the P channel transistor 11, that is, an output of the amplitude control signal PB. A gate of the P channel transistor 12 is connected with the ground.

The resistance 14 is a setting resistance, and is a resistance to change (set) the output amplitude of low amplitude differential signals OUT+ and OUT− that are the outputs of the output circuit 4 of the interface circuit 1. In other words, the output amplitude control bias PB is changed by changing the resistance value of the setting resistance 14, and as a result, the output amplitude of the RSDS output circuit 5 can be changed. In this manner, the bias voltage generation circuit 6 supplies the amplitude control signal PB and the reference voltage level signal CV to the output circuit 4.

Figure 5:
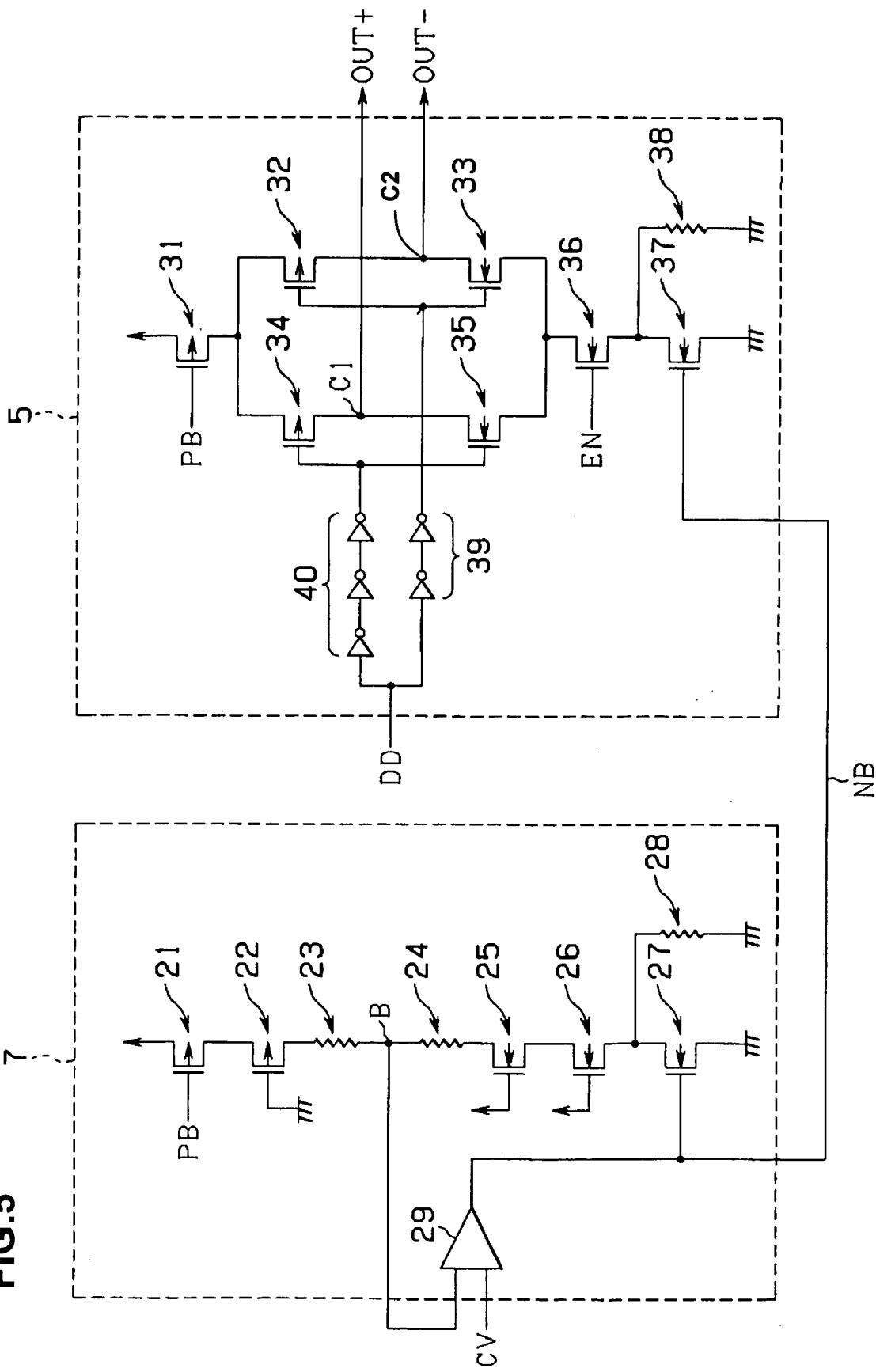
FIG. 5 is a circuit diagram showing a structure of an output circuit.

FIG. 5 is a circuit diagram that shows a structure of the output circuit 4. The output circuit 2 includes, as shown in FIG. 2, the center voltage level control signal generation circuit 7 and the RSDS output circuit 5. The center voltage level control signal generation circuit 7 includes a series circuit in which serially connected P channel transistors 21 and 22, serially connected resistances 23 and 24, and serially connected N channel transistor 25, 26 and 27 are connected in series. A resistance 28 is connected to a node of the N channel transistors 26 and 27. The center voltage level control signal generation circuit 7 includes a differential amplifier 29. One of input terminals of the differential amplifier 29 is connected to a node B of the resistances 23 and 24, and a reference voltage level signal CV is inputted to the other input terminal.

The RSDS output circuit 5 includes a series circuit in which a P channel transistor 31, a transistor parallel circuit including four transistors 32, 33, 34 and 35, an N channel transistor 36, and an N channel transistor 37 are connected in series. The transistor parallel circuit includes a series circuit having a P channel transistor 32 and an N channel transistor 33 connected in series, and a series circuit having a P channel transistor 34 and an N channel transistor 35 connected in series, which are connected in parallel. A resistance 38 is connected to a node of the N channel transistors 36 and 37. One end of two inverter circuits 39 connected in series is connected to the gates of the P channel transistor 32 and the N channel transistor 33. One end of three inverter circuits 40 connected in series is connected to the gates of the P channel transistor 34 and the N channel transistor 35. Digital signals DD from the timing control circuit 3 are supplied to the other ends of the inverter circuits 39 and 40.

A node C1 between a drain of the P channel transistor 34 and a drain of the N channel transistor 35, and a node C2 between a drain of the P channel transistor 32 and a drain of the N channel transistor 33 provide normal and reverse differential signals OUT+ and OUT−, respectively.

Here, in the center voltage level control signal generation circuit 7, a circuit including the transistors 21 and 22, the resistances 23 and 24, the N channel transistors 25, 26 and 27, and the resistance 28 is a copy circuit or a replica circuit of an output circuit in the RSDS output circuit 5 including the P channel transistor 31, the P channel transistor 32, the N channel transistor 33, the P channel transistor 34, the N channel transistor 35, the N channel transistor 36, the N channel transistor 37, and the resistance 38.

That is, when the digital signal DD from the timing control circuit 3 is inputted to the inverter circuits 39 and 40, in the RSDS output circuit 5, the P channel transistor 32 and the N channel transistor 35 turn on and the N channel transistor 33 and the P channel transistor 34 turn off, or the P channel transistor 32 and the N channel transistor 35 turn off and the N channel transistor 33 and the P channel transistor 34 turn on. As a result, an electric current flows through the P channel transistor 32, the N channel transistor 35 and the terminating resistance, or through the P channel transistor 34, the N channel transistor 33 and the terminating resistance, thereby forming an output circuit of differential signals.

The center voltage level control signal generation circuit 7 includes a circuit equivalent to the output circuit of differential signals thus structured, in other words, a circuit that is a copy of the RSDS output circuit 5. By providing such a copy circuit in the center voltage level control signal generation circuit 7, the output characteristics of the differential signals in the RSDS output circuit 5 can be reliably matched.

Next, the operations of the device are described.

In the bias voltage generation circuit 6, the differential amplifier 15 controls its output, that is, the amplitude control signal PB, so that the reference voltage level signal CV becomes a voltage at the node A. Therefore, if the voltage at the node A is a constant value, for example, 1.3V, the reference voltage level signal CV also becomes 1.3V, and the amplitude control signal PB also becomes a bias voltage value decided beforehand.

The differential amplifier 29 of the center voltage level control signal generation circuit 7 outputs an output signal, that is, the center voltage level control signal NB, to match the reference voltage level signal CV inputted to one of its input terminals with the voltage at the node B. This is because, the center voltage level control signal NB is supplied to the gate of the N channel transistor 27, and the electric current that flows between the source and the drain of the N channel transistor 27 changes, or the voltage applied between the drain and the source of the N channel transistor 27 and the voltage applied across both ends of the resistance 28 change, whereby the voltage at the node B matches with the reference voltage level signal CV.

The center voltage level control signal NB is supplied to the gate of the N channel transistor 37 of the RSDS output circuit 5, and the electric current that flows to the RSDS output circuit 5 with the output control signal EN inputted to the gate of the N channel transistor 36 is controlled, so that the voltage generated across both ends of the terminating resistance between the nodes C1 and C2 becomes the same voltage generated across both ends of the series circuit of the resistances 23 and 24, which is the copy circuit of the output circuit 5, included in the center voltage level control signal generation circuit 7.

Here, the RSDS output circuit 5 and the center voltage level control signal generation circuit 7 are formed at positions close to each other in terms of the distance on the semiconductor substrate of the semiconductor chip 1a. In other words, on the semiconductor substrate of the semiconductor chip 1a, the forming region of the RSDS output circuit 5 and the forming region of the center voltage level control signal generation circuit 7 are formed at a short distance from each other where the operation characteristics of the transistors included in each of the circuits become equal. Therefore, the center voltage level of differential signals outputted from the RSDS output circuit 5 can be set to a desired level, such that the differential signals can be reliably received by the circuit of the receiving side.

As described above, in accordance with the present embodiment described above, a semiconductor device can be achieved which is capable of setting the center voltage level of low amplitude differential signals to a desired value.

The present invention is not limited to the embodiment described above, and various changes and modifications can be made within the scope of the present invention.

What is claimed is:

1. A semiconductor device comprising:
   a differential signal output circuit that outputs a differential signal;
   an amplitude control signal generation circuit that generates an amplitude control signal to control an amplitude of the differential signal for the differential signal output circuit; and
   a center voltage level control signal generation circuit that generates a center voltage level control signal to control a center voltage level of the differential signal;
   wherein the differential signal output circuit outputs the differential signal having the center voltage level based on the center voltage level control signal and the amplitude based on the amplitude control signal; and
   a forming region of the center voltage level control signal generation circuit is located adjacent to a forming region of the differential signal output circuit on a semiconductor substrate where operation characteristics of transistors formed respectively in the two forming regions become equal.

2. A semiconductor device according to claim 1, wherein the center voltage level control signal generation circuit includes a circuit equivalent to a circuit included in the differential signal output circuit, wherein the equivalent circuit includes at least one circuit element that receives the center voltage level control signal.

3. A semiconductor device according to claim 2, further comprising a plurality of the differential signal output circuits;
   wherein the equivalent circuit is provided for each of the plurality of differential signal output circuits; and
   the amplitude control signal generation circuit supplies the amplitude control signal to each of the plurality of differential signal output circuits.

4. A semiconductor device, comprising:
   a differential signal receiving circuit that generates a first differential signal;
   a differential signal output circuit that outputs a second differential signal according to the first differential signal;
   an amplitude control signal generation circuit that generates an amplitude control signal to control an amplitude of the second differential signal for the differential signal output circuit; and
   a center voltage level control signal generation circuit that generates a center voltage level control signal to control a center voltage level of the second differential signal;
   wherein the differential signal output circuit outputs the second differential signal having the center voltage level based on the center voltage level control signal and the amplitude based on the amplitude control signal; and
   a forming region of the center voltage level control signal generation circuit is located adjacent to a forming region of the differential signal output circuit on a semiconductor substrate where operation characteristics of transistors formed respectively in the two forming regions become equal.

* * * * *